(12) United States Patent
Nakamura

(10) Patent No.: US 6,767,845 B2
(45) Date of Patent: Jul. 27, 2004

(54) METHOD OF MANUFACTURING SEMICONDUCTOR DEVICE

(75) Inventor: Naoki Nakamura, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 51 days.

(21) Appl. No.: 10/303,275

(22) Filed: Nov. 25, 2002

(65) Prior Publication Data

US 2003/0100194 A1 May 29, 2003

(30) Foreign Application Priority Data

Nov. 27, 2001 (JP) ........................................ 2001-361483

(51) Int. Cl.⁷ ............................................... H01L 21/31
(52) U.S. Cl. ........................ 438/758; 438/710; 438/788; 156/345.33
(58) Field of Search .............................. 438/758, 710; 156/345.33

(56) References Cited

U.S. PATENT DOCUMENTS

| | | | | |
|---|---|---|---|---|
| 4,401,507 A | * | 8/1983 | Engle | 216/65 |
| 5,277,752 A | * | 1/1994 | Aydil et al. | 216/67 |
| 5,352,902 A | * | 10/1994 | Aoki | 250/575 |
| 5,510,151 A | * | 4/1996 | Matsuyama et al. | 427/509 |
| 5,846,885 A | * | 12/1998 | Kamata et al. | 438/729 |
| 6,043,004 A | * | 3/2000 | Kurimoto | 430/329 |
| 6,497,826 B2 | * | 12/2002 | Li et al. | 216/67 |
| 6,499,425 B1 | * | 12/2002 | Sandhu et al. | 118/723 E |

* cited by examiner

*Primary Examiner*—John F. Niebling
*Assistant Examiner*—Olivia T. Luk
(74) *Attorney, Agent, or Firm*—Choate, Hall & Stewart

(57) ABSTRACT

A method of manufacturing a semiconductor device in which a thin film is formed on a semiconductor substrate using a reaction gas described in the present invention as active species is disclosed, where a film formation process is subdivided into multiple stages and a film is formed by varying the gas pressure or the gas flow speed of the active species within a reaction chamber for each stage.

12 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of uniformly forming a thin film on the surface of a semiconductor substrate.

2. Description of the Prior Art

An effort for further enhancing refinement and high density of the structure of semiconductor devices such as insulated gate field effect transistor (referred to as MOS) is still being pushed vigorously at this date. Such a refinement, being the most effective technique for imparting them with high performance or multifunctional capability through higher degree of integration, higher processing speed and the like of semiconductor devices, is becoming an indispensable process for the manufacture of future semiconductor devices.

At present, 256 megabit DRAM products have been developed on 0.13 μm design standard and are being manufactured. Moreover, in addition to such memory devices, development of logic devices with refined structure or a variety of mixed devices having fine structure, such as mixed logic memory devices, analog mixed logic devices, or the like, is presently under examination.

In conjunction with endowing high performance and multifunctional capabilities with the semiconductor devices mentioned above, it is necessary, along with the refinement of the design dimensions of the semiconductor devices, to enhance the quality of insulator films, conductor films or semiconductor films that constitute the semiconductor devices. In particular, reduction in the thickness and increase in the quality of the gate insulating film of a MOS transistor or the capacity insulating film of a capacitor are deemed .indispensable technological objectives.

In the conventional formation of a silicon oxide film which serves as the gate insulating film, it has been general to employ a method in which an oxidizing gas such as oxygen ($O_2$) gas or steam ($H_2O$) gas, as in pyrogenic oxidation, is used. In the formation of an oxynitride film, use of nitrous oxide (NO) gas or ammonia ($NH_3$) gas is general. However, thin films formed by the use of such a reaction gas is confronting the limit for improving the quality in view of their application to semiconductor devices.

Under these circumstances, various methods for forming a silicon oxide film or an oxynitride film to be used as the thin film for the gate insulating film by means of the reaction between an active species obtained by activating an oxidizing gas or a nitriding gas and a silicon substrate, have been under investigation. Such active species include, for example, oxygen or nitrogen that is converted to neutral free radical. At this point, as a technology readily applicable to mass production of a semiconductor device, there may be mentioned, for example, a method of forming a silicon oxide film by the use of an oxidizing active species obtained by the in-situ steam generation (ISSG) method as disclosed in IEEE Electron Device Letters, Vol. 21, No. 9, September 2000, pp. 382–384. In addition, as a technology for forming a silicon oxide film or an oxynitride film by the use of an active species such as an oxygen or nitrogen free radical, one might mention, for example, the methods disclosed in Japanese Patent Applications Laid Open, No. 2000-286259 and Japanese Patent Applications Laid Open, No. 2001-291866.

Referring to FIG. 10 to FIG. 12, formation of a silicon oxide film by the ISSG method will now be described as a representative example of the conventional technology.

FIG. 10 is a schematic sectional view of a reaction chamber section of a single wafer type film formation device. In a reaction chamber section 101, a rotating support substrate 103 with a wafer 104 placed thereon, is disposed below a reaction chamber 102. Above the reaction chamber 102, there is provided a lamp chamber 106 via a transparent glass window 105. The wafer 104 is heated to about 1000° C. by the lamp. Oxygen gas and hydrogen ($H_2$) gas are introduced separately into the reaction chamber through a gas introducing port 107, and the gas after the reaction is discharged to the outside by a pump through a gas discharge port 108. The gas pressure inside the reaction chamber is arranged to be reducible to below $2 \times 10^3$ Pa. The reaction chamber 102 is connected to a load lock chamber (not shown), and the wafer 104 is loaded/unloaded through the load lock chamber.

A feature of the ISSG method resides in the point that the reaction chamber is kept at a reduced pressure, differing from the conventional oxidation method. Oxygen and hydrogen entering the reaction chamber through the gas introducing port 107 are subjected to a thermal reaction under the reduced pressure to be converted to steam ($H_2O$), oxygen atom (O) and a hydroxyl free radical (OH), brought into reaction with the surface portion or the like of the silicon substrate being the wafer 104, and forms a silicon oxide film on the wafer 104.

Referring to FIG. 11, the sequence of processes of the ISSG method in the conventional film formation method will be described. In FIG. 11, the abscissa shows the processing time and the ordinate shows the gas pressure in the reaction chamber 102. As shown in FIG. 11, prior to the film formation, nitrogen gas is introduced into the reaction chamber 102 to be kept at a prescribed reduced pressure state (for example, at a pressure of $2 \times 10^3$ Pa). Then, the wafer 104 is brought into the reaction chamber from the load lock chamber. Following that, the pressure inside the reaction chamber is reduced to, for example, about $7 \times 10^2$ Pa, oxygen gas and hydrogen gas are introduced into the reaction chamber 102 as shown in FIG. 11, and the formation of the silicon oxide film is started. During the film formation, the gas pressure in the reaction chamber 102 is kept constant (at $7 \times 10^2$ Pa in the above example). The wafer 104 is rotated during the process in order to enhance the uniformity of the in-plane thickness of the wafer. Upon completion of the film formation the introduction of oxygen gas and hydrogen gas is stopped, they are replaced by nitrogen gas and its pressure is returned to the value ($2 \times 10^3$ Pa in this example) before the above treatment. Thereafter the wafer 104 is taken out to the load lock chamber.

Next, the film thickness distribution will be described with reference to FIG. 12 when a silicon oxide film is formed on the surface of the silicon substrate according to the above process sequence. Here, the abscissa shows the location in the radial direction from the center of the wafer. In this example, the wafer is a silicon wafer of 8" diameter, and the wafer position X represents the distance of the point under consideration measured from the center of the wafer as indicated by the percentage relative to the radius of the wafer. The ordinate shows the thickness of the silicon oxide film. As shown in FIG. 12, the distribution is such that the thickness of the silicon oxide film increases from the central part of the wafer toward its outer periphery, reaches a maximum past midpoint, then decreases toward as one moves toward the outer periphery of the wafer. The dispersion of the thickness in the wafer plane of the silicon oxide film is about +/2%. There is no change in the film thickness in the rotational direction of the wafer.

With the enhancement of the performance of the semiconductor devices, it is general to demand prevention of deterioration in the quality of the formed thin film and to reduce the dispersion of the film thickness, along with the requirement for high precision of the processing dimensions. Moreover, since the increase in the wafer diameter is the most effective means for enhancing the yield of nondefective products, the shift on the mass production line from the 8" silicon wafer to a larger diameter wafer of 12" wafer is destined to take place. Under these circumstances, further reduction in the dispersion of the film thickness of the thin films becomes necessary when thin films such as silicon oxide film are to be formed by means of the active species such as done in the conventional technology described in the above. Considering the requirement for high performance and the increase in the diameter of the wafer for the future semiconductor devices, it is indispensable to suppress the dispersion of the film thickness to below +/1%. However, according to the result of various kinds of investigation carried out so far by the present inventor, indication is that the dispersion of the film thickness of the silicon oxide film by the present state of art of the ISSG method is +/2% at the best. With this knowledge in mind, the present inventor searched and experimented various methods toward further enhancement of the dispersion of film thickness in the wafer plane when the film is formed generally by the use of active species such as neutral free radicals.

As a result of the search, it was found when a film is formed by the use of active species, without being limited to the case of the ISSG method, that the dispersion of the film thickness depends very heavily on the change with the lapse of time of the active species in the reaction chamber for film formation. The present invention is based on such new findings by the present inventor.

BRIEF SUMMARY OF THE INVENTION
Summary of the Invention

This is a method of manufacturing a semiconductor device in which a thin film is formed on a semiconductor substrate by using reaction gas of the present invention as active species, wherein a film is formed by subdividing the film formation process into multiple stages, and the gas pressure or the gas flow speed of the active species is varied in each stage.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
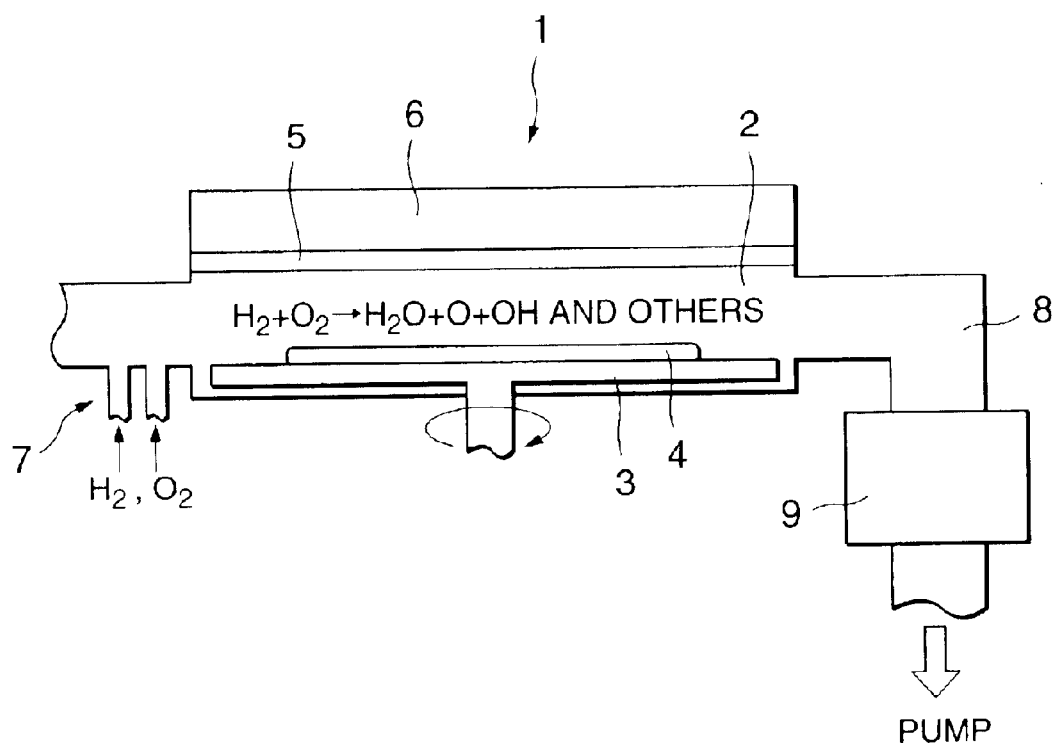
FIG. 1 is a schematic sectional view of a reaction chamber section of a film formation device for describing a first embodiment of the present invention.
Figure 10:
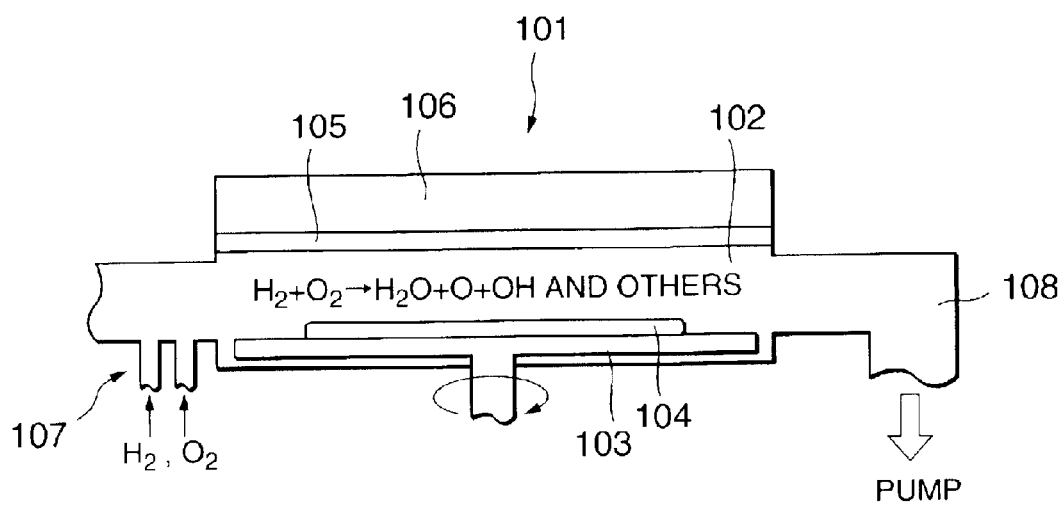
FIG. 10 is a schematic diagram of the reaction chamber section of the film formation device for describing the conventional technique.
Figure 11:
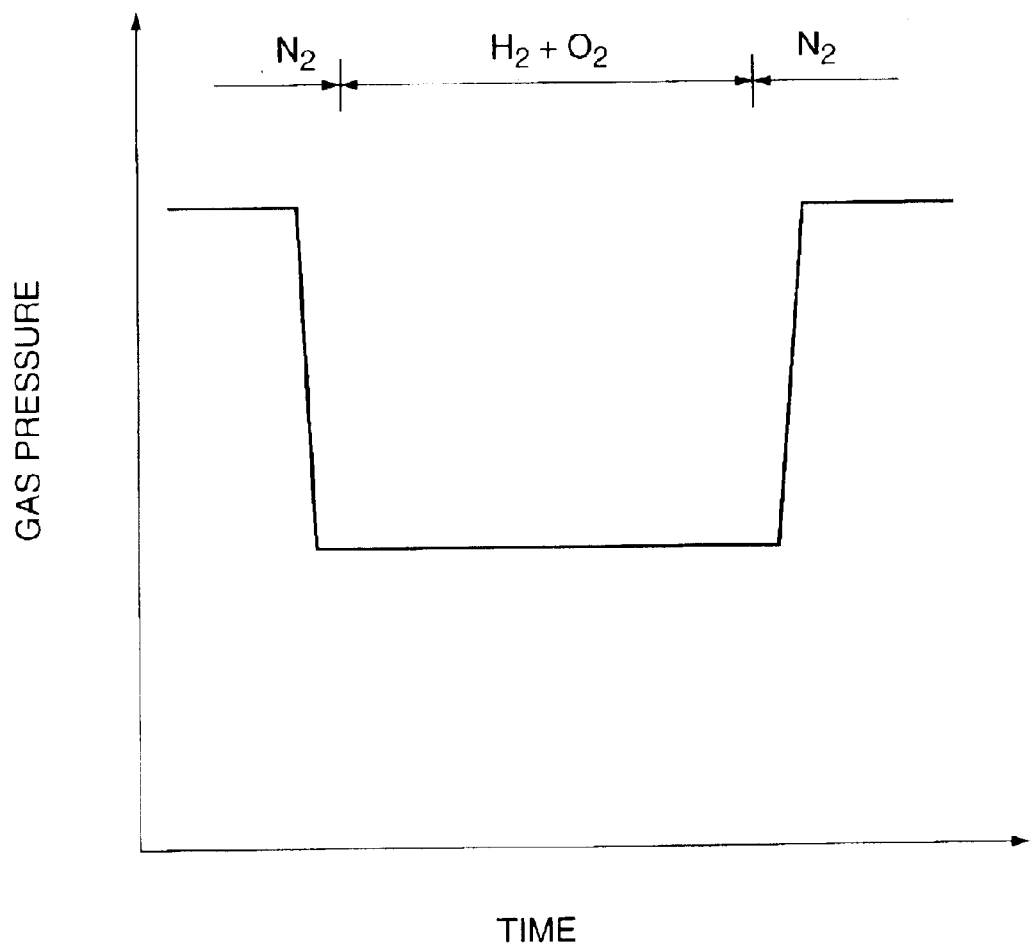
FIG. 11 is a process sequence diagram showing the gas pressure during film formation for describing the conventional technique.
Figure 12:
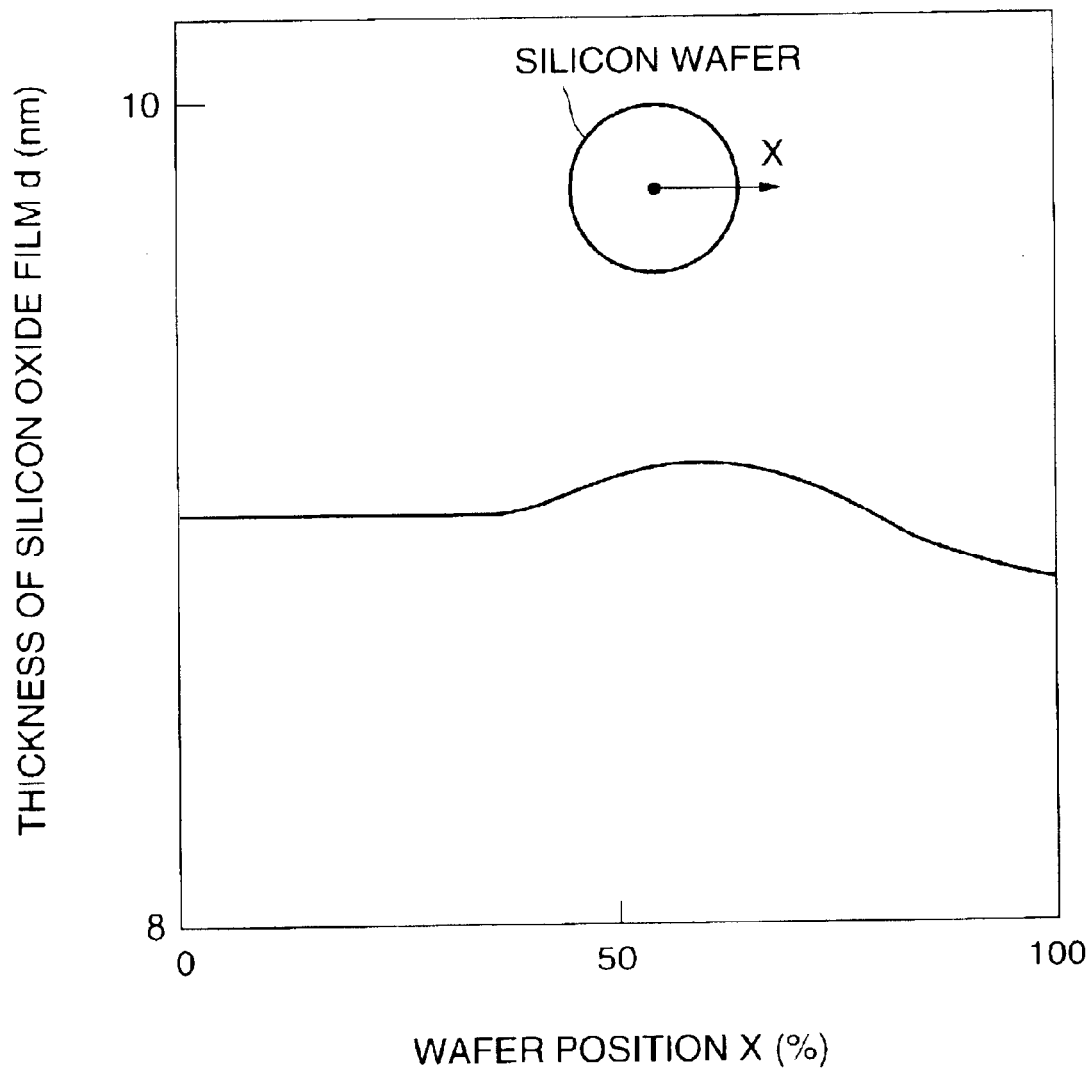
FIG. 12 is a distribution diagram of the silicon oxide film in the wafer plane for describing the conventional technique.

Referring to FIG. 1 to FIG. 5, a first embodiment of the present invention will be described. Here, FIG. 1 is a schematic sectional view of the reaction chamber section of the film formation device of single wafer type used in the ISSG method described above. It has the same configuration as that described in FIG. 10, and in a reaction chamber section 1, a rotating support substrate 3 with a wafer 4 placed thereon is disposed below a reaction chamber 2, and a transparent glass window 5 and a lamp chamber 6 are provided in the upper part of the reaction chamber 2. The wafer 4 is heated by the lamp in the chamber 6. Oxygen gas and hydrogen gas are introduced separately into the reaction chamber through a gas introducing port 7, and the gas after reaction is discharged to the outside by a pump through a gas discharge port 8. Next to the gas discharge port 8, there is disposed a pressure regulating section 9 which can vary the pressure of the reaction gas during film formation, as shown in FIG. 1.

Figure 2:
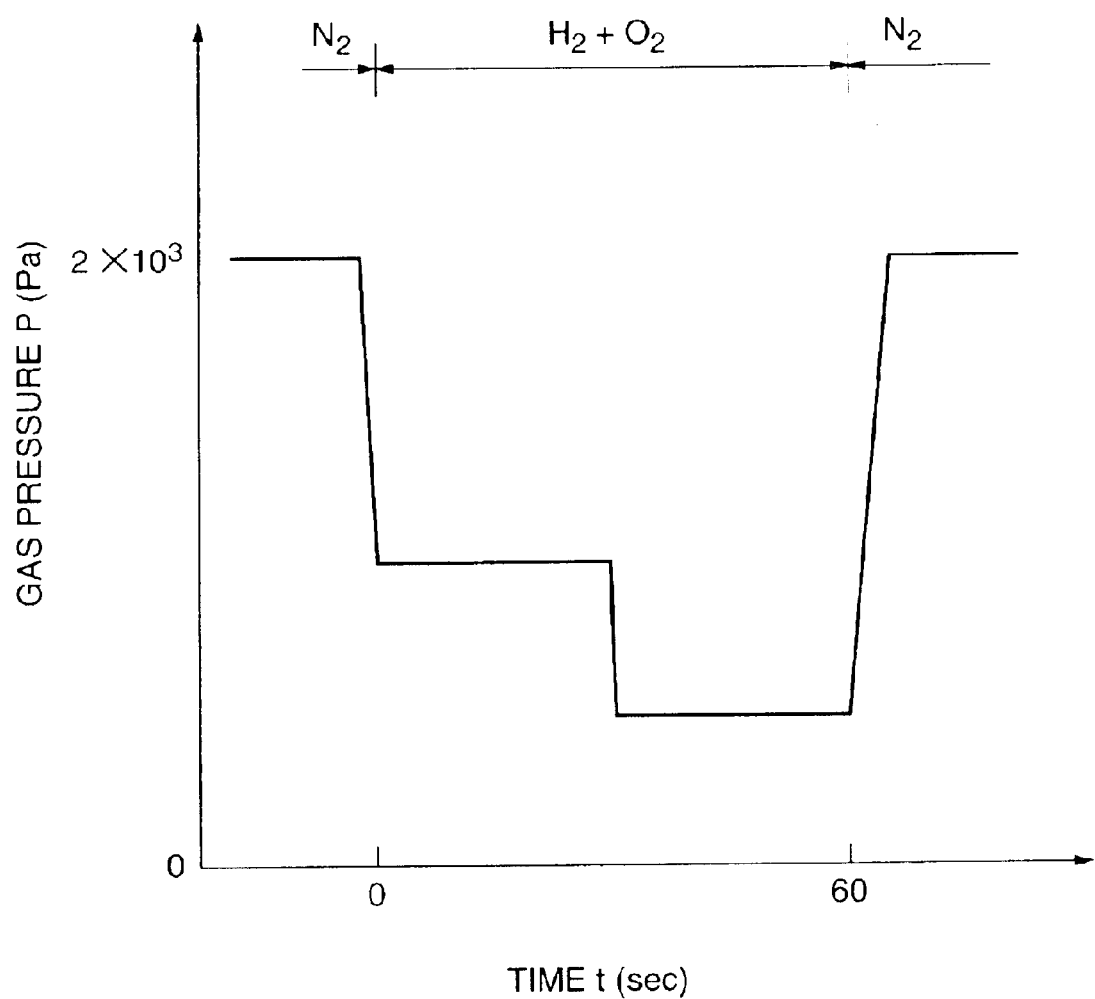
FIG. 2 is a process sequence diagram showing the change in the gas pressure during film formation for describing the invention.

Next, the film formation method according to the present invention will be described based on the process sequence in the ISSG method as shown in FIG. 2. The feature of the invention resides in the point that the pressure of the reaction gas during film formation is varied by regulation.

In FIG. 2, the abscissa is the oxidation time and the ordinate is the gas pressure in the reaction chamber 2. As shown in FIG. 2, prior to the film formation, the reaction chamber 2 is filled with nitrogen gas to keep the chamber in a prescribed reduced pressure state ($2 \times 10^3$ Pa). The wafer 4 is carried into the reaction chamber 2 from a load lock chamber. Then, the gas pressure is lowered to $1 \times 10^3$ Pa in one step, oxygen gas and hydrogen gas are introduced into the reaction chamber 2, and formation of a silicon oxide film is started.

Next, a pressure regulating section 9 is actuated to lower the gas pressure to $5 \times 10^2$ Pa in the midst of the film formation as shown in FIG. 2. Here, the reaction gas introduced into are oxygen and hydrogen introduced into the reaction chamber undergo no change, and the wafer 4 is rotated in order to enhance the thickness uniformity in the wafer plane.

Upon completion of the film formation, introduction of oxygen gas and hydrogen gas is stopped, they are replaced by nitrogen gas of pressure $2 \times 10^3$ Pa as in the beginning, and the wafer 4 is taken out to be brought to the load lock chamber.

Next, the thickness distribution of the silicon oxide film when it is formed on the surface of the silicon substrate according to the above process sequence constituting this invention will be described with reference to FIG. 3. As described in connection with the conventional technique, the abscissa shows the position in the radial direction as measured from the center of the wafer. In this example, the wafer has a diameter of 8", and the wafer position X is represented as the percentage with respect to the farthest point in the outer periphery. The ordinate represents the thickness of the silicon oxide film.

Figure 3:
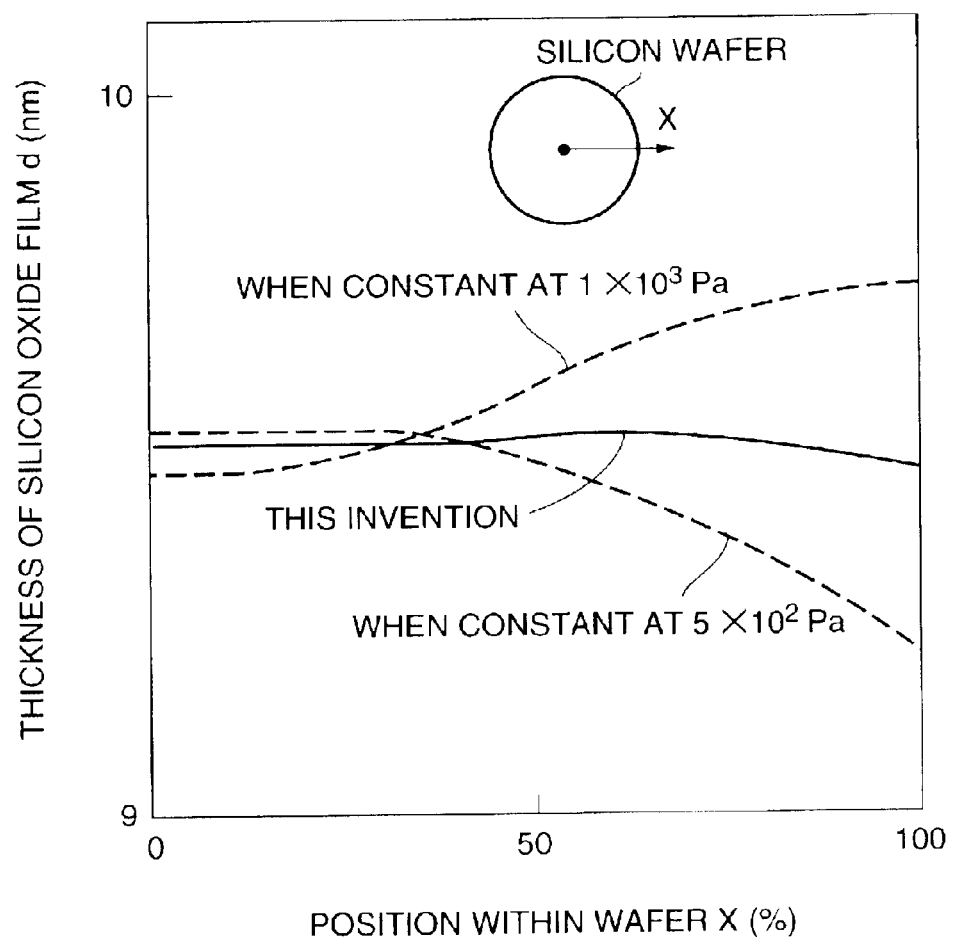
FIG. 3 is a thickness distribution diagram of silicon oxide film in the wafer plane for describing the effect of the first embodiment of the invention.

As shown in the solid line in FIG. 3, the dispersion of the thickness of the silicon oxide film is lowered to about +/0.5%. It is to be noted that there occurs no change in the film thickness in the direction of wafer rotation. In the figure, results for the cases of keeping the gas pressure constant during the film formation according to the conventional technique are given as a reference. When the gas pressure is kept constant at $1 \times 10^3$ Pa, the thickness of the silicon oxide film increases monotonically from the central part of the wafer toward its outer periphery. In contrast, when the gas pressure is kept constant constant at $5 \times 10^2$ Pa, the thickness of the silicon oxide film decreases monotonically from the central part of the wafer toward its outer periphery.

The present invention corresponds to the time modulation of the gas pressure during film formation between the two levels in the above, so that the dispersion of the film thickness can be reduced to a large extent.

Figure 4:
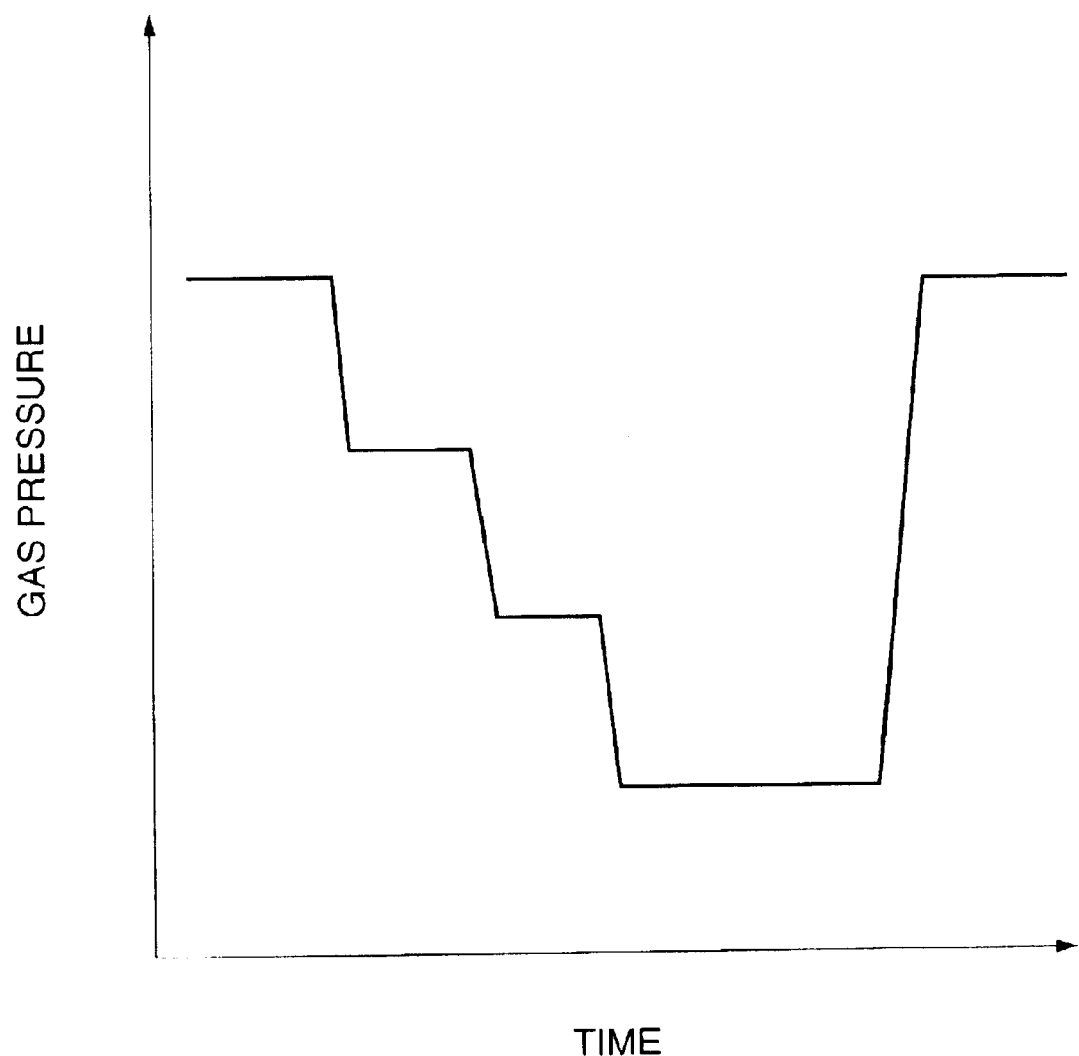
FIG. 4 is another process sequence diagram showing the change in the gas pressure during film formation for describing the invention.
Figure 5:
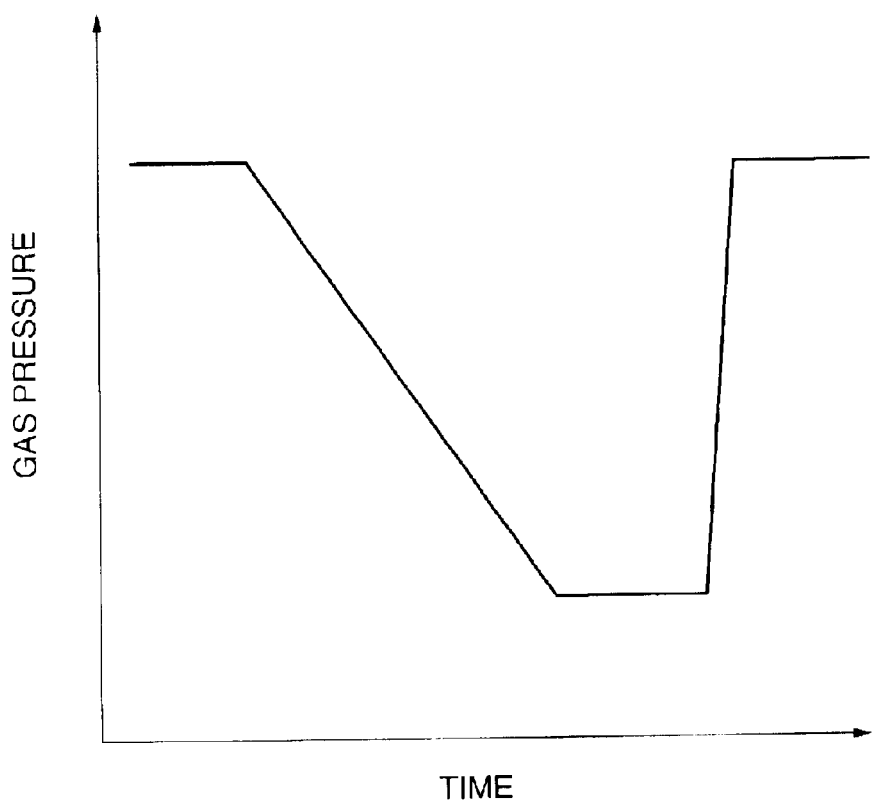
FIG. 5 is another process sequence diagram showing the change in the gas pressure during film formation for describing the invention.

The method of time modulation of the reaction gas during film formation in this invention is not limited to the case of two steps as in the above. Other possible methods will be described briefly using FIG. 4 and FIG. 5. FIG. 4 refers to the case in which the gas pressure during film formation is varied in three steps. By changing the gas pressure in multiple stages as in this case, it is possible to control the film thickness distribution in the wafer plane with high precision. The basic mechanism of reduction in the dispersion is as described in connection with FIG. 3. In FIG. 4, the gas pressure during film formation is varied digitally. In contrast, FIG. 5 shows schematically a case in which the gas pressure during film formation is varied monotonically in analog fashion. In this case, it is possible to reduce dispersion of film thickness, although there is required some inventive idea for the gas regulating section 9.

In a method of varying the gas pressure during the film formation as is done in this invention, a similar effect can be made to be produced by increasing the gas pressure with the lapse of time, contrary to the above method in which the gas pressure is decreased with the lapse of the film formation time.

Figure 6:
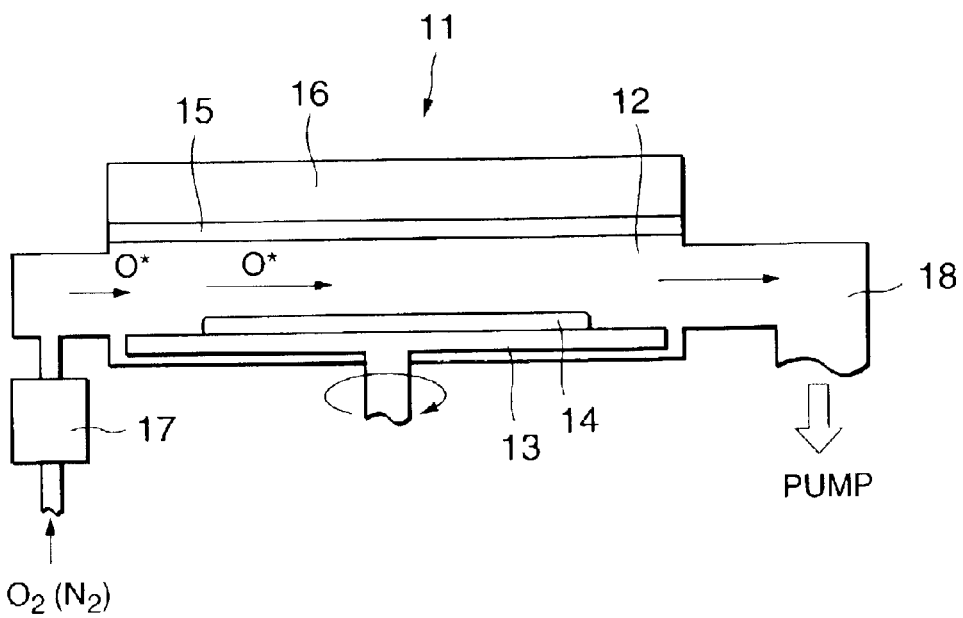
FIG. 6 is a schematic sectional view of the reaction chamber section of the film formation device for describing a second embodiment of the invention.

Next, referring to FIG. 6 to FIG. 9, a second embodiment of the invention will be described. FIG. 6 is a schematic sectional view of the reaction chamber section of the film formation device when a thin film is formed using neutral radicals of oxygen and nitrogen as reaction gas. In this case, the device is also a single wafer type, so that the situation is basically similar to what has been described in connection with FIG. 1.

Similar to the description given in conjunction with FIG. 1, in a reaction chamber section 11, a rotating support substrate 13 with a wafer 14 placed thereon is disposed below a reaction chamber 12, and a transparent glass window 15 and a lamp chamber 16 are provided above the reaction chamber 12. The wafer 14 is heated by means of a lamp in the chamber 16. Oxygen gas or nitrogen gas is plasma excited in a plasma excitation chamber 17. After removal of ions or the like formed in the excitation chamber, neutral radicals of oxygen (or nitrogen) are introduced into the reaction chamber 12 as shown in FIG. 6. The gas after reaction is discharged to the outside by a pump through a gas discharge port 18.

Next, referring to FIG. 7 for a process sequence of film formation, the formation method of an oxynitride film by this embodiment will be described. The feature of this embodiment resides in the point that the flow speed of the free neutral radical gas during film formation is varied by regulation.

Figure 7:
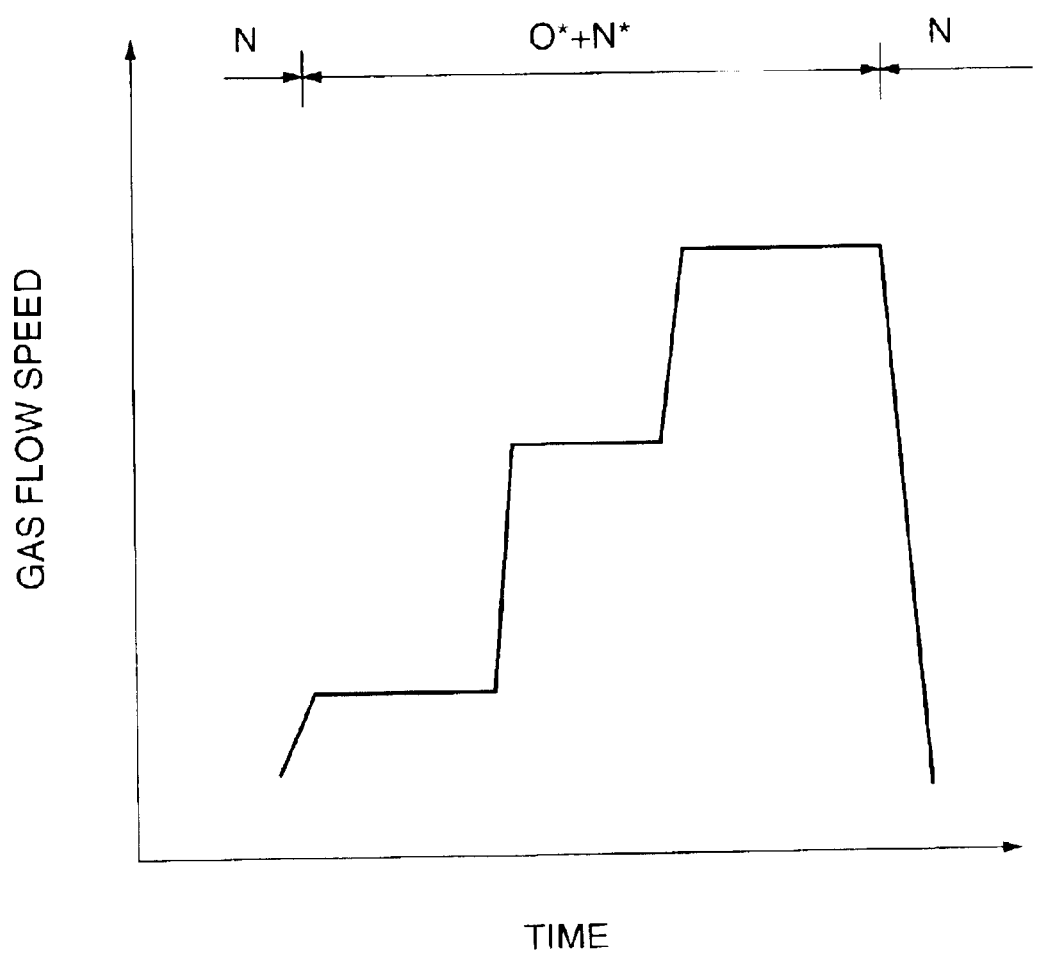
FIG. 7 is a process sequence diagram showing the change in the gas flow speed during film formation for describing the invention.

In FIG. 7, the abscissa represents the film formation time and the ordinate represents schematically the gas flow speed in the reaction chamber 12. As shown in FIG. 7, prior to the film formation, the reaction chamber 12 is kept at a constant reduced pressure state by introduction of nitrogen gas. The wafer 14 is brought into the reaction chamber 12 from the load lock chamber. Then, oxygen free radicals and nitrogen free radicals are introduced into the reaction chamber 12 in one step at the same speed and are set at the state of lowest possible flow speed to start formation of an oxynitride film through reaction with the surface of the silicon wafer.

Next, the flow speed of the radical gas is raised stepwise as shown in FIG. 7. Here, the regulation of the gas flow speed is carried out based on the gas flow rate of oxygen (or nitrogen) introduced into the plasma excitation chamber. At the same time, a pump is regulated so as to make the gas pressure of the radicals in the reaction chamber constant. Besides, the wafer 14 is rotated in order to enhance the uniformity of film thickness within the wafer plane.

Upon completion of the film formation, introduction of the oxygen radicals and the nitrogen radicals is stopped, and they are replaced by nitrogen gas. After that, the wafer 14 is brought out to the load lock chamber.

Next, the film thickness distribution when an oxynitride film is formed on the silicon substrate according to the above sequence of processes which constitutes the present invention, will be described by reference to FIG. 8. Here, as in the first embodiment, the abscissa shows the position in the radial direction from the center of the wafer, and the ordinate shows the thickness of the oxynitride film.

Figure 8:
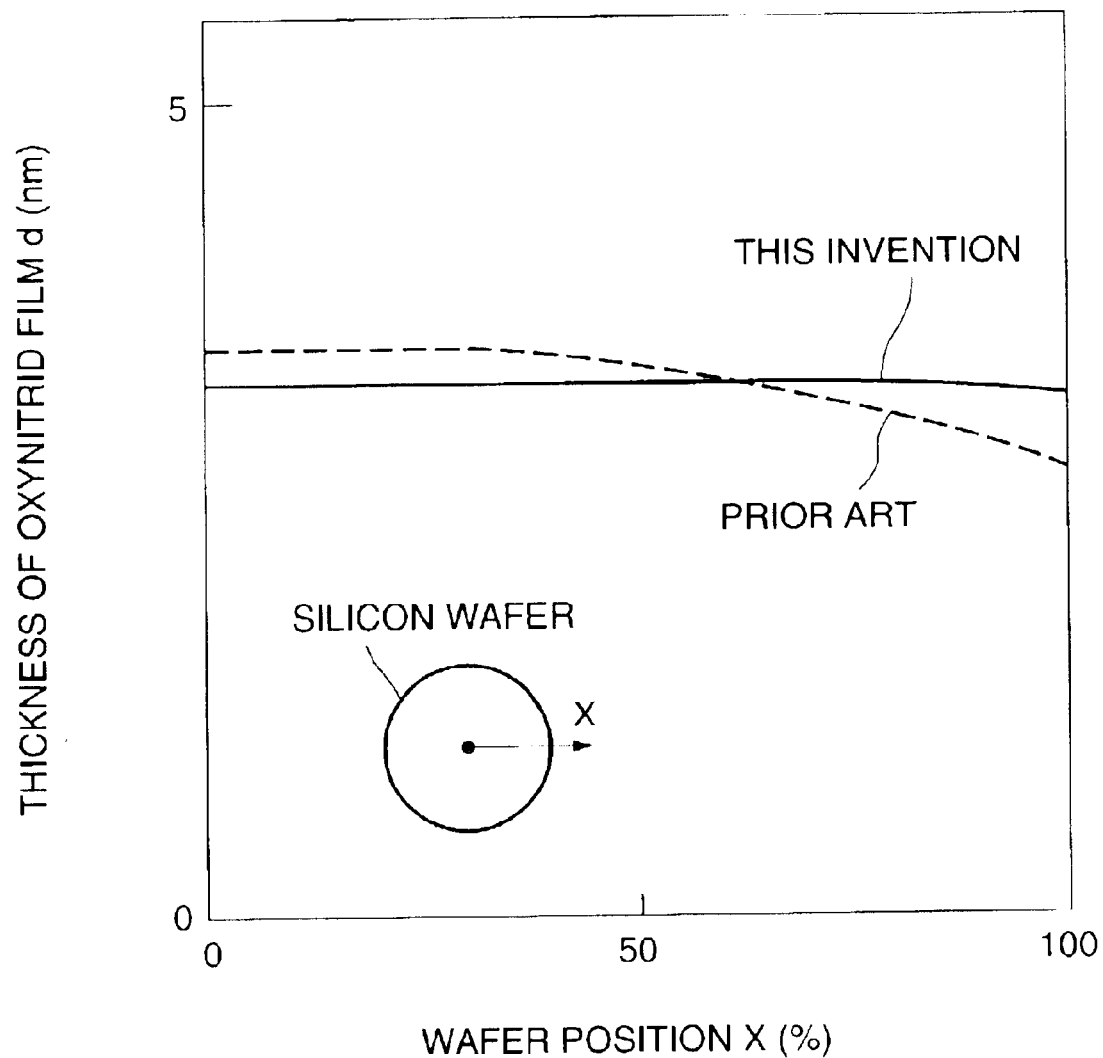
FIG. 8 is a distribution diagram of an oxynitride film in the wafer plane for describing the effect of the second embodiment of the invention.

As shown by the solid line in FIG. 8, when an oxynitride film with thickness of about 3 nm is formed, the dispersion of the film thickness is lowered to about +/1%. It is to be noted that there is no change in the film thickness in the direction of rotation of the wafer. In the figure, the result for the case according to the conventional technique where the gas flow speed is kept constant during the film formation is shown in broken line for reference. In this case, the thickness of the oxynitride film decreases monotonically from the central part of the wafer toward its periphery. The dispersion of the film thickness in this case is about +/10%. In this manner, the dispersion of the film thickness can be reduced to a large extent according to this invention.

In the case of the second embodiment, the flow speed of the reaction gas during film formation can also be time modulated, and the dispersion of the film thickness can be reduced to a large extent.

Although the flow speeds of the oxygen radicals and the nitrogen radicals are made equal in the above description, the gas flow speed of respective radicals may be varied with time separately. Moreover, a silicon oxide film may be formed using oxygen radicals alone, or a portion of the silicon oxide film may be converted to a silicon nitride film by irradiating the surface of the silicon oxide film with beams consisting exclusively of nitrogen radicals. Furthermore, effects similar to the above can be obtained also by varying the gas flow speed in analog fashion rather than varying it digitally.

Figure 9:
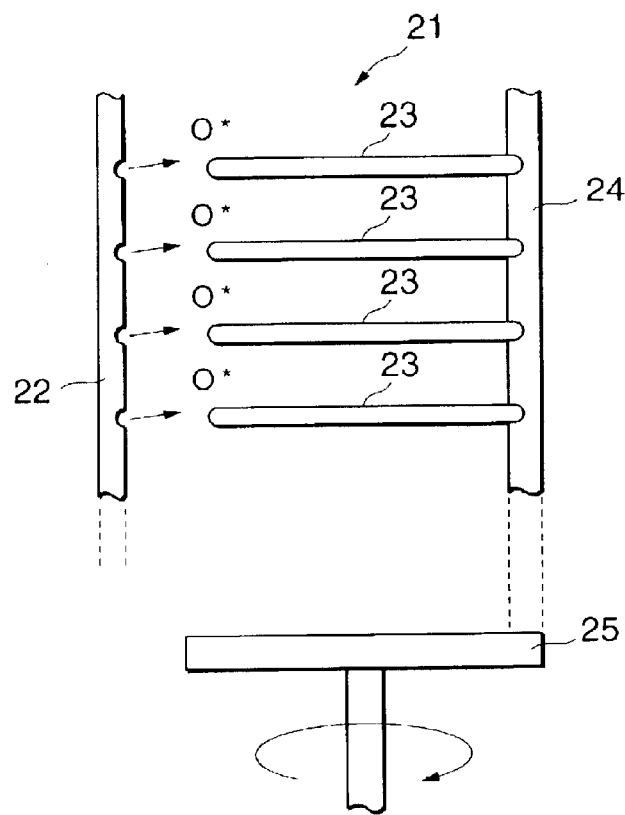
FIG. 9 is a schematic diagram of a reaction chamber section of a batch type film formation device for describing the second embodiment of the invention.

Moreover, the present invention is not limited to film formation of single wafer mode alone. A film formation device of batch mode will be described briefly in the following. FIG. 9 is a schematic sectional view of the reaction chamber section 21 of the batch mode film formation device.

As shown in FIG. 9, a nozzle 22 having a large number of openings (gas introducing ports) is inserted in a reaction chamber section 21 like, for example, in the interior of a vertical core tube. Wafers 23 are placed one on top of another supported by a support tube 24 at positions corresponding to the openings (gas introducing ports). The support tube 24 is fixed to a pedestal 25 which is allowed to rotate.

During film formation, surfaces of the wafers 23 are irradiated with a reaction gas composed of, for example, oxygen radicals, which is let in the reaction chamber section 21 with its flow speed controlled, as shown in FIG. 9. In this way silicon oxide films or oxynitride films are formed with their film thickness controlled. During film formation, the wafers 23 are rotated through the rotation of the pedestal 25.

As described in the above, the film formation method according to the present invention is especially effective when the reaction gas or active species vary with the time. Moreover, the method of this invention is particularly effective when the introducing port of the reaction gas or active species into the reaction chamber is limited to one location. Furthermore, it is confirmed that effects similar to the above are obtainable even when the introducing ports of the reaction gas or active species are at several prescribed places. As a result, this invention can generate effects similar to the above even when films are formed by chemical vapor deposition (CVD), or a resist film is removed by etching as in ashing, provided that conditions described in the above are satisfied, without being limited to the cases of formation of silicon oxide films or oxynitride films as described in the embodiments.

The present invention is not limited to the above embodiments, and the embodiments can appropriately be modified within the scope of the technical concept of the invention.

As described in the above, in this invention of film formation using active species, the gas pressure or the gas flow speed within the reaction chamber is time modulated.

In this way, the supply of the active species to the surface of the semiconductor substrate can be made uniform, and in the film formation using active species, dispersion of the film thickness in the plane of the wafer, being the semiconductor substrate, can be reduced in a simple manner. As a result, the film formation technology employing oxygen radicals or nitrogen radicals can be made applicable positively to mass production of semiconductor devices.

Although the invention has been described with reference to specific embodiments, this description is not to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device in which a thin film is formed on a semiconductor substrate using a reaction gas as active species, wherein said film formation process is subdivided into multiple stages and the film is formed by varying the gas pressure or the gas flow speed of said active species within a reaction chamber for each stage.

2. A method of manufacturing a semiconductor device in which a thin film is formed on a semiconductor substrate using a reaction gas as active species, wherein said film formation process is carried out by continuously varying the gas pressure or the gas flow speed of said active species within a reaction chamber.

3. The method of manufacturing a semiconductor device as claimed in claim 1, wherein said film formation process is subdivided into two stages in which the gas pressure of said active species within said reaction chamber in a first stage is set to be higher than that in a second stage.

4. The method of manufacturing a semiconductor device as claimed in claim 1, wherein said film formation process is subdivided into two stages in which the gas flow speed of said active species within said reaction chamber in a first stage is set to be smaller than that in a second stage.

5. The method of manufacturing a semiconductor device as claimed in claim 1, wherein said reaction gas is composed of oxygen gas and hydrogen gas and said active species consists of oxygen atom and hydroxyl free radical.

6. The method of manufacturing a semiconductor device as claimed in claim 5, wherein said reaction gas is introduced into said reaction chamber from a prescribed location in said reaction chamber and is converted into said active species within said reaction chamber.

7. The method of manufacturing a semiconductor device as claimed in claim 5, wherein a plurality of semiconductor substrates are placed one on top of another in said reaction chamber, a nozzle having openings provided at positions corresponding to respective semiconductor substrates is equipped in said reaction chamber, and said reaction gas is introduced to the surface of said semiconductor substrates from said openings to be converted into said active species within said reaction chamber.

8. The method of manufacturing a semiconductor device as claimed in claim 1, wherein said reaction gas is oxygen gas and said active species is oxygen radical.

9. The method of manufacturing a semiconductor device as claimed in claim 1, wherein said reaction gas is nitrogen gas and said active species is nitrogen radical.

10. The method of manufacturing a semiconductor device as claimed in claim 1, wherein said reaction gas is nitrous oxide gas and said active species are oxygen free radical and nitrogen free radical.

11. The method of manufacturing a semiconductor device as claimed in either one of claims 8, 9 and 10, wherein said active species are generated in a gas excitation chamber separate from said reaction chamber and said active species are introduced into said reaction chamber from prescribed locations of said reaction chamber.

12. The method of manufacturing a semiconductor device as claimed in either one of claims 8, 9 and 10, wherein a plurality of semiconductor substrates are placed one on top of another within said reaction chamber, a nozzle having openings at locations corresponding to respective semiconductor substrates is equipped in said reaction chamber, said active species are generated in an excitation chamber separate from said reaction chamber and said active species are introduced to the surface of said semiconductor substrates from said openings.

* * * * *